United States Patent
Kwon et al.

(10) Patent No.: US 10,666,467 B2
(45) Date of Patent: May 26, 2020

(54) MEMORY DEVICE AND OPERATION METHOD THEREOF

(71) Applicant: SAMSUNG ELECTRONICS CO., LTD., Suwon-si, Gyeonggi-Do (KR)

(72) Inventors: Hye Jung Kwon, Seoul (KR); Seungjun Bae, Hwaseong-si (KR); Yongjae Lee, Suwon-si (KR); Young-Sik Kim, Gunpo-si (KR); Young-Ju Kim, Hwaseong-si (KR); Suyeon Doo, Seoul (KR); Yoon-Joo Eom, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/108,894

(22) Filed: Aug. 22, 2018

(65) Prior Publication Data
US 2019/0158320 A1 May 23, 2019

(30) Foreign Application Priority Data
Nov. 17, 2017 (KR) .................. 10-2017-0154288

(51) Int. Cl.
| | | |
|---|---|---|
| G11C 7/10 | (2006.01) | |
| H04L 25/02 | (2006.01) | |
| G11C 13/00 | (2006.01) | |
| G11C 16/26 | (2006.01) | |
| G11C 11/16 | (2006.01) | |

(52) U.S. Cl.
CPC ...... *H04L 25/0278* (2013.01); *G11C 11/1659* (2013.01); *G11C 13/004* (2013.01); *G11C 16/26* (2013.01); *G11C 2207/2254* (2013.01)

(58) Field of Classification Search
CPC ................................................. G11C 29/022
USPC .......................................................... 326/30
See application file for complete search history.

(56) References Cited

U.S. PATENT DOCUMENTS

| | | | | |
|---|---|---|---|---|
| 7,323,900 B2* | 1/2008 | Kim | ....................... | G11C 29/02 326/30 |
| 7,599,220 B2 | 10/2009 | Lin et al. | | |
| 7,852,112 B2 | 12/2010 | Kao | | |
| 7,893,710 B2 | 2/2011 | Lee | | |
| 7,994,813 B2* | 8/2011 | Sohn | ................... | H04L 25/0278 326/30 |
| 9,030,233 B2 | 5/2015 | Dono et al. | | |
| 9,110,827 B2 | 8/2015 | Sakai et al. | | |
| 9,219,560 B2 | 12/2015 | Hummel | | |

(Continued)

FOREIGN PATENT DOCUMENTS

| | | |
|---|---|---|
| JP | 2012-203957 | 10/2012 |
| JP | 5870901 | 3/2016 |

(Continued)

*Primary Examiner* — Min Huang
(74) *Attorney, Agent, or Firm* — F. Chau & Associates, LLC

(57) ABSTRACT

A memory device includes memory cell array including a plurality of memory cells that store data, a first transmitter that transmits the data to an external device through a first data line, and a ZQ controller that performs a ZQ calibration operation to generate a first ZQ code for impedance matching of the first data line. The first transmitter encodes the first ZQ code and the first data based on a first clock and drives the first data line based on the encoded result based on a second clock.

20 Claims, 15 Drawing Sheets

(56) References Cited

U.S. PATENT DOCUMENTS

| | | |
|---|---|---|
| 9,472,275 B2 | 10/2016 | Park et al. |
| 9,524,790 B1 | 12/2016 | Steiner et al. |
| 9,548,128 B2 | 1/2017 | Alhussien et al. |
| 9,582,454 B2 | 2/2017 | Hsueh et al. |
| 2010/0007373 A1* | 1/2010 | Wong .................. H04L 25/0278 326/30 |
| 2013/0147536 A1* | 6/2013 | Kim ....................... H03K 5/133 327/276 |
| 2017/0104947 A1 | 4/2017 | Nishino |
| 2017/0154657 A1 | 6/2017 | Kim |

FOREIGN PATENT DOCUMENTS

| | | |
|---|---|---|
| KR | 10-2005-0107964 | 11/2005 |
| KR | 10-0744039 | 7/2007 |
| KR | 10-2016-0014473 | 2/2016 |
| KR | 10-2017-0062254 | 6/2017 |

\* cited by examiner

MEMORY DEVICE AND OPERATION METHOD THEREOF

CROSS-REFERENCE TO RELATED APPLICATIONS

This application claims priority under 35 U.S.C. § 119 from Korean Patent Application No. 10-2017-0154288 filed Nov. 17, 2017, in the Korean Intellectual Property Office, the disclosure of which is incorporated by reference herein in its entirety.

TECHNICAL FIELD

Embodiments of the inventive concept disclosed herein relate to a semiconductor memory, and more particularly, relate to a memory device and an operation method thereof.

DISCUSSION OF THE RELATED ART

Semiconductor memory devices may be classified into volatile memory devices, which lose data stored therein at power-off, and non-volatile memory devices, which retain data stored therein even at power off.

Examples of volatile memory devices include, for example, static random access memory (SRAM), a dynamic RAM (DRAM), a synchronous DRAM (SDRAM), and the like.

Examples of non-volatile memory devices include, for example, a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like.

In general, a DRAM device communicates with a memory controller or a host by using a high-speed interface such as a double data rate (DDR) interface. In this case, if impedance matching of a signal line or a data line is not accomplished, a signal provided through the signal line or the data line is reflected, thereby causing reduction of the signal quality.

SUMMARY

Embodiments of the inventive concept may provide a memory device with enhanced performance and reduced power consumption and an operation method thereof.

According to an exemplary embodiment of the inventive concept, a memory device may include a memory cell array having a plurality of memory cells configured to store data, a first transmitter that transmits the data to an external device through a first data line, and a ZQ controller that performs a ZQ calibration operation to generate a first ZQ code. The first transmitter encodes the first ZQ code and the first data based on a first clock and drives the first data line based on the encoded result based on a second clock.

According to an exemplary embodiment of the inventive concept, an operation method of a memory device includes encoding data and a ZQ code based on a first clock to generate pull-up data and pull-down data, serializing the pull-up data and the pull-down data based on a second clock, and driving a first data line based on the serialized pull-up data and the serialized pull-down data.

According to an exemplary embodiment of the inventive concept, a memory device includes a memory cell array that includes a plurality of memory cells configured to store data, a data line driver that provides the data to an external device through a plurality of data lines, and a ZQ controller that generates a ZQ code associated with each of the plurality of data lines. The data line driver encodes the ZQ code and the data based on a first clock to generate pull-up data and pull-down data, with respect to each of the plurality of data lines, serializes the pull-up data and the pull-down data based on a second clock, and respectively drives the plurality of data lines based on the serialized pull-up data and the serialized pull-down data.

BRIEF DESCRIPTION OF THE DRAWINGS

The above and other features of the embodiments of the inventive concept will be better-appreciated by a person of ordinary skill in the art with reference to the accompanying drawings.

DETAILED DESCRIPTION

Below, embodiments of the inventive concept may be described in detail to an extent that one of ordinary skill in the art may implement the appended claims without undue experimentation.

The term, which performs a specific function or includes a specific function, such as "block", "unit", "module", "driver", "circuit", or the like to be described below or illustrated in drawings may be implemented in the form of software, hardware, or a combination thereof.

Figure 1:
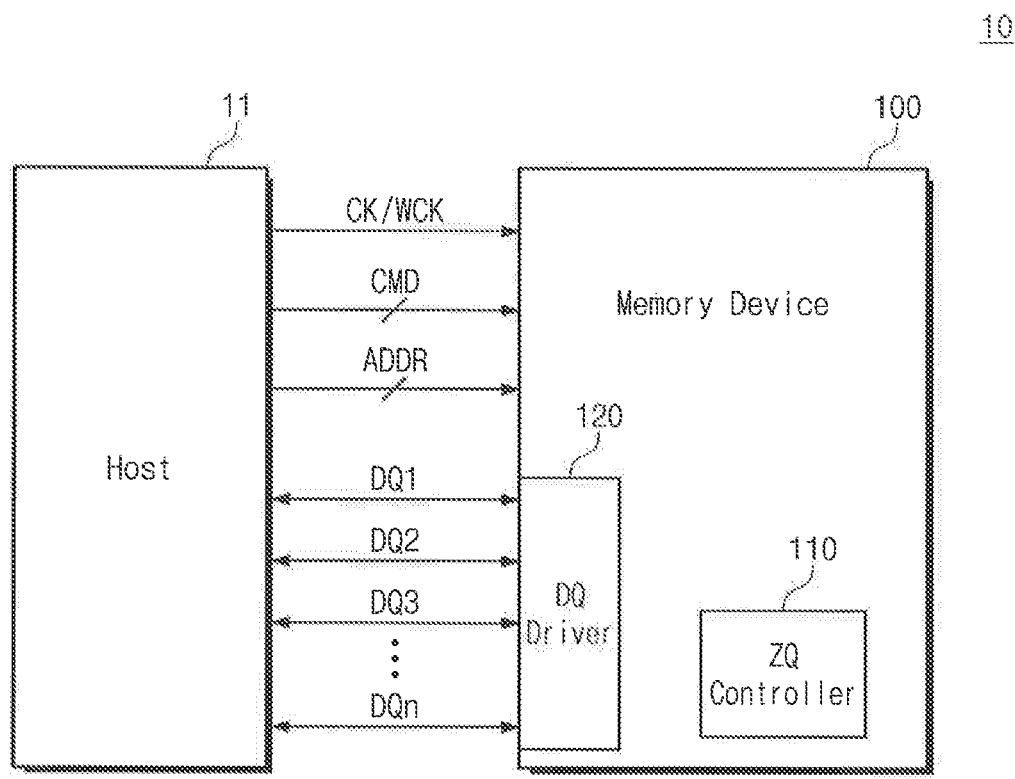
FIG. 1 is a block diagram illustrating a memory system according to an embodiment of the inventive concept.

FIG. 1 is a block diagram illustrating a memory system according to an embodiment of the inventive concept. Referring to FIG. 1, a memory system 10 may include, for example, a host 11 and a memory device 100.

To store data in the memory device 100 or to read data stored in the memory device 100, the host 11 may transmit a system clock CK, a data clock WCK, a command CMD, and an address ADDR to the memory device 100. The host 11 may exchange data with the memory device 100 through a plurality of data lines DQ1 to DQn. In an embodiment of the inventive concept, the host 11 may be a memory controller or a central processing unit (CPU).

According to an embodiment of the inventive concept, the host 11 may communicate with the memory device 100 based on a high-speed interface such as, for example, a double data rate (DDR) interface. However, the scope and spirit of the embodiments of the inventive concept are not limited thereto. For example, the host 11 may communicate with the memory device 100 based on at least one of various types of communication interfaces such as, for example, a universal serial bus (USB) interface, a multimedia card (MMC) interface, an embedded MMC (eMMC) interface, a peripheral component interconnection (PCI) interface, a PCI-express (PCI-E) interface, an advanced technology attachment (ATA) interface, a serial-ATA interface, a parallel-ATA interface, a small computer small interface (SCSI), an enhanced small disk interface (ESDI), an integrated drive electronics (IDE) interface, a Firewire interface, a universal flash storage (UFS) interface, and a nonvolatile memory express (NVMe) interface. A person of ordinary skill in the art should understand and appreciate that the aforementioned examples are not the only types of interfaces that may be used for communication.

The memory device 100, which operates under the control of the host 11, may store data received through the plurality of data lines DQ1 to DQn or may transmit data stored therein to the host 11 through a plurality of data lines DQ1 to DQn. In an embodiment of the inventive concept, the memory device 100 may include a dynamic random access memory (DRAM). However, the scope and spirit of the embodiments of the inventive concept are not limited to the examples shown and described. For example, the memory device 100 may include at least one of various memory devices such as a static random access memory (SRAM), a DRAM, a synchronous DRAM (SDRAM), a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like.

The memory device 100 may include a ZQ controller 110 and a data line driver 120. The ZQ controller 110 may control impedance of each of the plurality of data lines DQ1 to DQn such that impedance matching is accomplished with respect to each of the plurality of data lines DQ1 to DQn. In an embodiment of the inventive concept, "ZQ" may be used as the term that collectively refers to "input/output impedance".

In an embodiment of the inventive concept, the impedance of each of the plurality of data lines DQ1 to DQn may be adjusted through a pull-up driver and a pull-down driver included in the data line driver 120. The ZQ controller 110 may determine a pull-up code and a pull-down code for controlling a pull-up driver and a pull-down driver associated with each of the plurality of data lines DQ1 to DQn through the ZQ calibration operation.

The data line driver 120 may be configured to control the plurality of data lines DQ1 to DQn, respectively. For example, the data line driver 120 may detect signals of the plurality of data lines DQ1 to DQn to determine data provided from the host 11. For example, the data line driver 120 may operate as a receiver. The data line driver 120 may transmit data to the host 11 by controlling a voltage of each of the plurality of data lines DQ1 to DQn. In other words, example, the data line driver 120 may also operate as a transmitter. Herein below, a description will be given under assumption that the data line driver 120 is a transmitter. However, the scope and spirit of the various embodiments of the inventive concept is not limited thereto.

In an embodiment of the inventive concept, the data line driver 120 may encode data based on a pull-up code and a pull-down code received from the ZQ controller 110 to control each of the plurality of data lines DQ1 to DQn. In an embodiment, the encoding operation may be performed based on the system clock CK, and the operation of controlling each of the plurality of data lines DQ1 to DQn may be performed based on the data clock WCK.

In an embodiment of the inventive concept, the system clock CK may be used to process or determine the command CMD or the address ADDR, and the data clock WCK may be used to transmit and receive data through the plurality of data lines DQ1 to DQn. A frequency of the system clock CK may be lower than that of the data clock WCK. An embodiment is illustrated in FIG. 1 as the host 11 transmits the system clock CK and the data clock WCK. However, the scope and spirit of the embodiments of the inventive concept may not be limited thereto. For example, the memory device 100 may generate the system clock CK, the data clock WCK, or any other clock signal by using a separate dock generator (not illustrated). In addition, while FIG. 1 shows one line CK/WCK, embodiments of the inventive concept may have a dedicated line from each clock generator, for example, in the case of separate clock generators. Alternatively, the memory device 100 may receive the system clock CK from the host 11, and generate the data clock based on the received system dock CK.

As described above, the memory device 100 according to the inventive concept may adjust the impedance of each of the plurality of data lines DQ1 to DQn. In this case, the memory device 100 may encode a ZQ code and data by using the system clock CK, and may drive each of the plurality of data lines DQ1 to DQn by using the data clock WCK. Here, the system clock CK may be relatively slower than the data clock WCK. Accordingly, power consumption may be reduced, and power noise is reduced.

Figure 2:
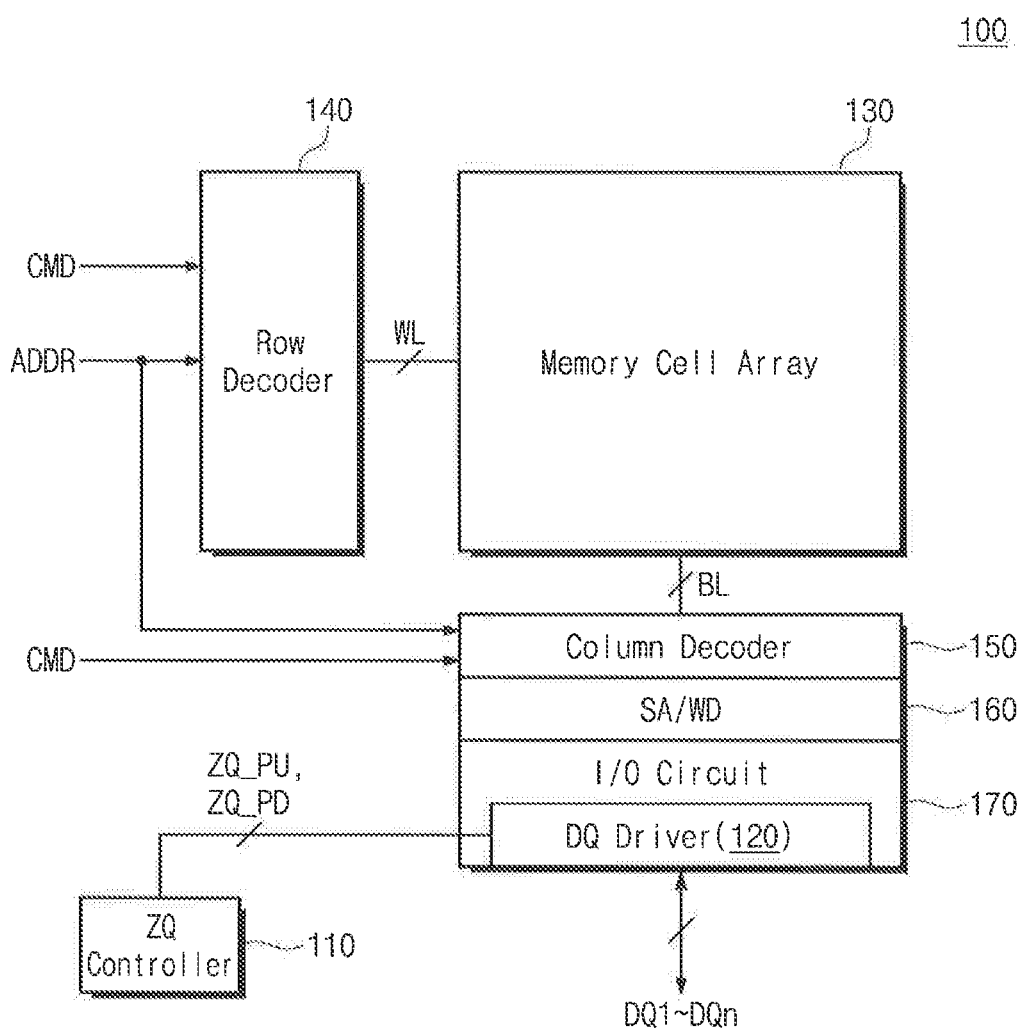
FIG. 2 is a block diagram illustrating a memory device of FIG. 1 in detail.

FIG. 2 is a block diagram illustrating the memory device 100 of FIG. 1 in more detail. Referring to FIGS. 1 and 2, the memory device 100 may include the ZQ controller 110, a memory cell array 130, a row decoder 140, a column decoder 150, a sense amplifier/write driver 160, and an input/output circuit 170. The ZQ controller 110 has been described herein above, and thus, a detailed description thereof will not be repeated here.

The memory cell array 130 may include a plurality of memory cells. The memory cells may be connected with a plurality of word lines WL and a plurality of bit lines BL. Each of the memory cells may be configured to store data by controlling the word lines WL and the bit lines BL. Each of the memory cells may be a DRAM cell that includes a storage capacitor and a transmission transistor.

The row decoder 140 may be connected with the memory cell array 130 through the word lines WL. The row decoder 140 may control voltages of the word lines WL in response to the receipt of the address ADDR and the command CMD. In an embodiment, the address ADDR may be a row address, and the command CMD may be a row address strobe (RAS) signal.

The column decoder 150 may be connected with the memory cell array 130 through the bit lines BL. The column decoder 150 may receive the address ADDR and the command CMD and may select at least one bit line of the bit lines BL in response to the received signals. In an embodiment, the address ADDR may be a column address, and the command CMD may be a column address strobe (CAS) signal provided to the column decoder 150. The sense amplifier/write driver 160 may sense or control a voltage of the bit line selected by the column decoder 150.

The input/output circuit 170 may be connected with the plurality of data lines DQ1 to DQn and may exchange data with an external device (e.g., the host 11) through the plurality of data lines DQ1 to DQn.

In an embodiment of the inventive concept, the input/output circuit 170 may include the data line driver 120, or alternatively, the data line driver 120 may be a separate circuit. As described with reference to FIG. 1, the data line driver 120 may receive a pull-up code ZQ_PU and a pull-down code ZQ_PD from the ZQ controller 110, and may control the plurality of data lines DQ1 to DQn based on the received codes ZQ_PU and ZQ_PD, respectively.

For example, the data line driver 120 may encode data from the sense amplifier/write driver 160 based on the pull-up code ZQ_PU and the pull-down code ZQ_PD from the ZQ controller 110. The data line driver 120 may drive a pull-up driver and a pull-down driver connected with each of the plurality of data lines DQ1 to DQn based on the encoded information. In this case, the encoding operation may be performed based on the system clock CK, and the driving operation may be performed based on the data clock WCK. A configuration and an operation of the data line driver 120 will be more fully described with reference to the following drawings.

Figure 3:
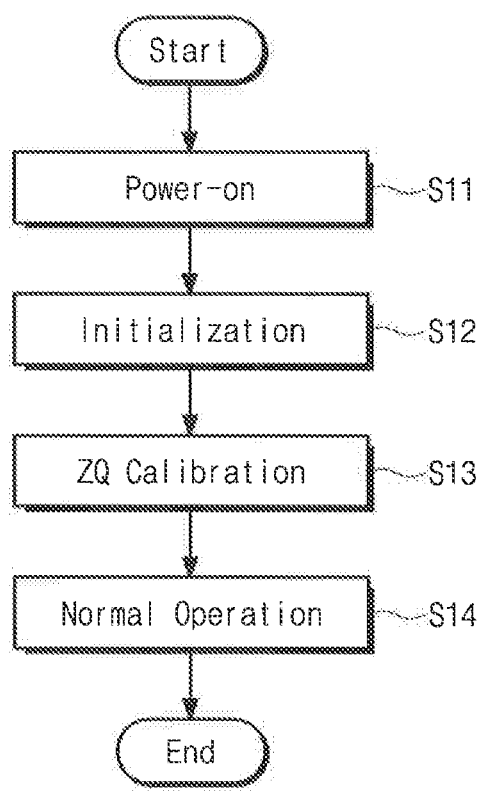
FIG. 3 is a flowchart illustrating an operation of the memory device of FIG. 2.

FIG. 3 is a flowchart illustrating an example of an operation of a memory device of FIG. 2. A ZQ calibration operation for generating the pull-up code ZQ_PU and the pull-down code ZQ_PD of the memory device 100 will be described with reference to FIG. 3. However, a person of ordinary skill in the art should understand and appreciate that the scope and spirit of embodiments of the inventive concept is not limited thereto.

Referring to FIGS. 2 and 3, in operation S11, the memory device 100 may be powered on. Alternatively, the memory device 100 may have been previously powered on from a prior task.

In operation S12, in a case where the memory device 100 was just powered on, the memory device 100 may perform an initialization operation. For example, the memory device 100 may perform the initialization operation for setting various information utilized by the memory device 100 to operate depending on a preset manner.

In operation S13, the memory device 100 may perform the ZQ calibration operation. For example, the memory device 100 may generate the pull-up code ZQ_PU and the pull-down code ZQ_PD for controlling a pull-up driver and a pull-down driver connected with each of the plurality of data lines DQ1 to DQn such that, for example, impedance matching with an external resistor provided through a separate pin (e.g., a ZQ pin) is accomplished with respect to each of the plurality of data lines DQ1 to DQn. For example, the pull-up code ZQ_PU and the pull-down code ZQ_PD may be codes for controlling a pull-up driver and a pull-down driver connected with each of the plurality of data lines DQ1 to DQn.

In operation S14, the memory device 100 may execute a normal operation for which it has been configured. For example, in a normal operation, the memory device 100 may encode data based on a pull-up code and a pull-down code to control a pull-up driver and a pull-down driver, and thus, the memory device 100 may transmit data to the host 11 through the plurality of data lines DQ1 to DQn.

The above-described operation of the memory device 100 according to the aforementioned embodiment of the inventive concept is only exemplary, and the scope and spirit of the embodiments of inventive concept are not limited thereto. In an embodiment of the inventive concept, the ZQ calibration operation may be performed in another manner. For example, the ZQ calibration operation may be performed according to various conditions, such as a temperature change and the like, while the memory device 100 is operating.

Figure 4:
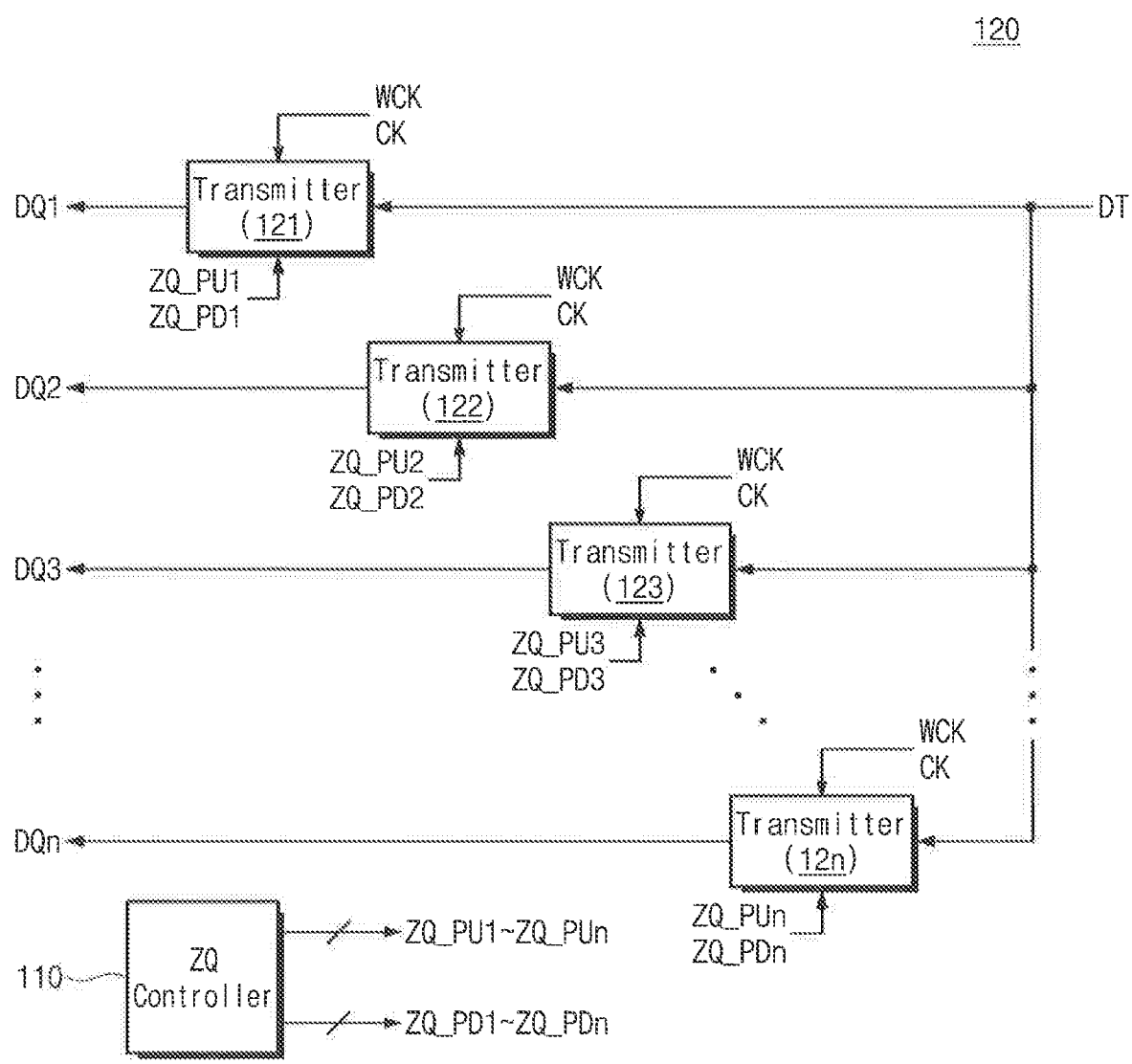
FIG. 4 is a block diagram illustrating a data line driver of FIG. 2.
Figure 5:
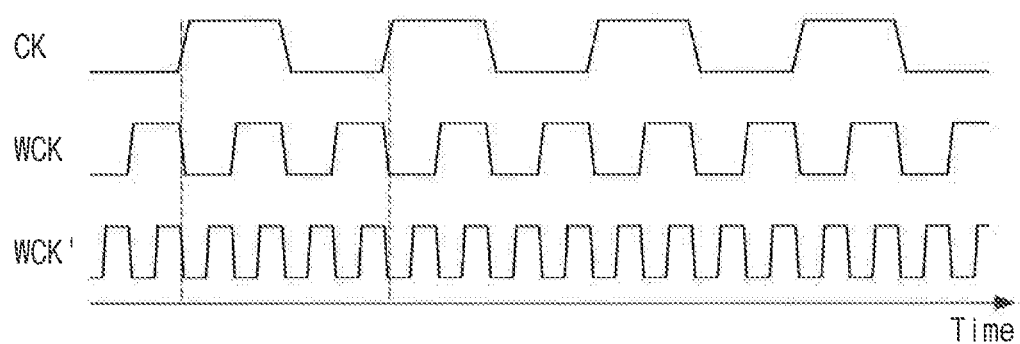
FIG. 5 is a timing diagram illustrating an example of operation of a system clock and a data.

FIG. 4 is a block diagram illustrating the data line driver 120 of FIG. 2. FIG. 5 is a timing diagram for describing the system clock CK and the data clock WCK. The data line driver 120 illustrated in FIG. 4 includes a transmitter associated with each of the plurality of data lines DQ1 to DQn. However, the scope and spirit of embodiments of the inventive concept may not be limited thereto. For example, the data line driver 120 may further include a receiver associated with each of the plurality of data lines DQ1 to DQn, and has been omitted from the diagram in FIG. 4 so as not to obscure the operations under discussion.

Referring to FIGS. 4 and 5, the data line driver 120 may include a plurality of transmitters 121 to 12n. The plurality of transmitters 121 to 12n may be connected with the plurality of data lines DQ1 to DQn, respectively. Each of the plurality of transmitters 121 to 12n may receive an input of the corresponding pull-up code (one of ZQ_PU to ZQ_PUn) and the corresponding pull-down code (one of ZQ_PD1 to ZQ_PDn).

For example, the first transmitter 121 may receive a first pull-up code ZQ_PU1 and a first pull-down code ZQ_PD1. Similarly, the second transmitter 122 may receive a second pull-up code ZQ_PU2 and a second pull-down code ZQ_PD2. Likewise, the third to n-th transmitters 123 to 12n may receive third to n-th pull-up codes ZQ_PU3 to ZQ_PUn and third to n-th pull-down codes ZQ_PD3 to ZQ_PDn, respectively. In an embodiment of the inventive concept, the pull-up codes ZQ_PU1 to ZQ_PUn and the pull-down codes ZQ_PD1 to ZQ_PDn may be values that are determined through the ZQ calibration operation described with reference to FIG. 3, or by a separate ZQ calibration operation.

Each of the plurality of transmitters 121 to 12n may encode data DT based on the received pull-up and pull-down codes. In such a case, the plurality of transmitters 121 to 12n may perform the above-described encoding operation based on the system clock CK. In an embodiment of the inventive concept, the system clock CK may be a signal received from the host 11 to determine the command CMD or the address ADDR.

The plurality of transmitters 121 to 12n may respectively drive the plurality of data lines DQ1 to DQn based on the encoded information. Each of the plurality of transmitters 121 to 12n may perform the above-described driving operation based on the data clock WCK. In an embodiment, the data clock WCK may be a signal received from the host 11 for the purpose of transmitting and receiving data.

A frequency of the data clock WCK may be higher than that of the system clock CK. For example, as illustrated in FIG. 5, the system clock CK may output a clock signal having a first frequency. In contrast, a data clock WCK or WCK' may be a signal having a second frequency. In this case, the second frequency may be two times or four times the first frequency. However, the scope and spirit of the inventive concept is not limited thereto. For example, a frequency of the data clock WCK may be higher than that of the system clock CK.

As described above, the plurality of transmitters 121 to 12n may be configured to perform the encoding operation based on the system clock CK, and to drive the plurality of data lines DQ1 to DQn based on the data clock WCK. Accordingly, since the encoding operation is performed by using a relatively slow clock (e.g., the system clock CK), power consumption and power noise may be reduced.

Figure 6:
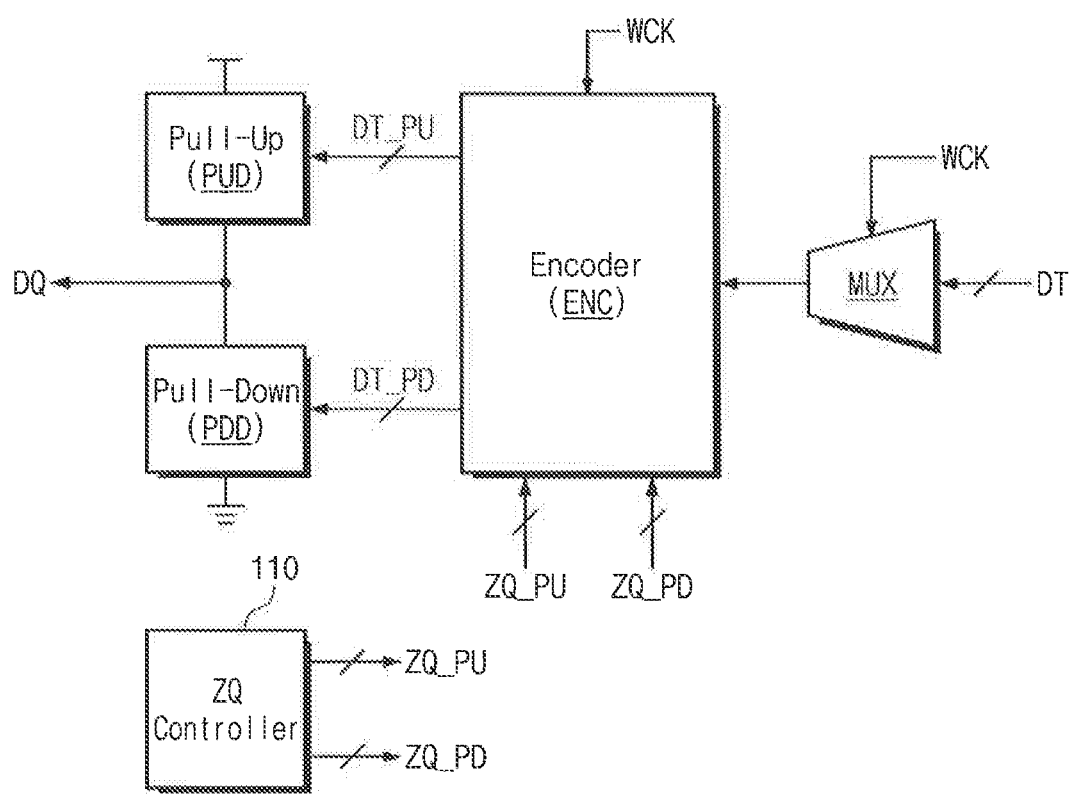
FIG. 6 is a block diagram illustrating a transmitter.

FIG. 6 is a block diagram illustrating a transmitter according to an embodiment of the inventive concept. Referring to FIG. 6, the transmitter may include a multiplexer MUX, an encoder ENC, a pull-up driver PUD, and a pull-down driver PDD. The data DT that is input to the MUX may be read from a memory cell of a memory array. The multiplexer MUX may perform multiplexing on the data DT based on the data clock WCK. For example, the multiplexer MUX may serialize and output the data DT based on the data clock WCK.

The encoder ENC may receive the corresponding pull-up code ZQ_PU and the corresponding pull-down code ZQ_PD from the ZQ controller 110, and the serialized data from the multiplexer MUX, and may encode the received signals to output encoded pull-up data DT_PU and encoded pull-down data DT_PD. In this case, the encoder ENC may perform the above-described encoding operation based on the data clock WCK.

Subsequently, the pull-up driver PUD and the pull-down driver PDD may drive a data line DQ in response to the encoded pull-up data DT_PU and the encoded pull-down data DT_PD received from the encoder ENC. In an embodiment of the inventive concept, impedance matching of the data line DQ may be accomplished by the operation of the pull-up driver PUD and the pull-down driver PDD, and a signal corresponding to the data DT may be provided to an exterior of the first transmitter.

As described above, the transmitter of FIG. 6 operates based on the operation of the data clock WCK. In this case, since the data clock WCK is a high-speed signal, the data clock WCK may cause an increase in power consumption or generated power noise of the data line DQ. In addition, or alternatively, the issues of one or more of increased power consumption and power noise may cause the reliability of encoded data to be reduced due to the high-speed encoding operation.

Figure 7:
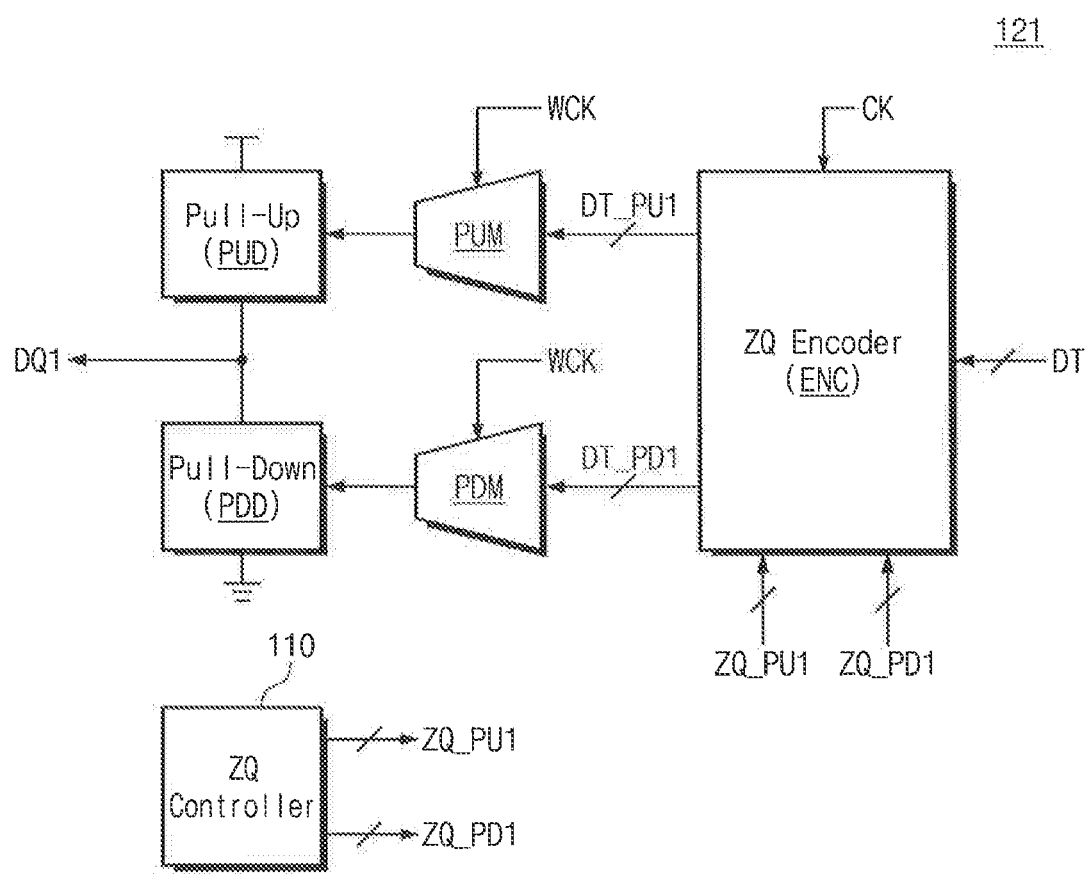
FIG. 7 is a block diagram illustrating a first transmitter of FIG. 4 according to an embodiment of the inventive concept.
Figure 8:
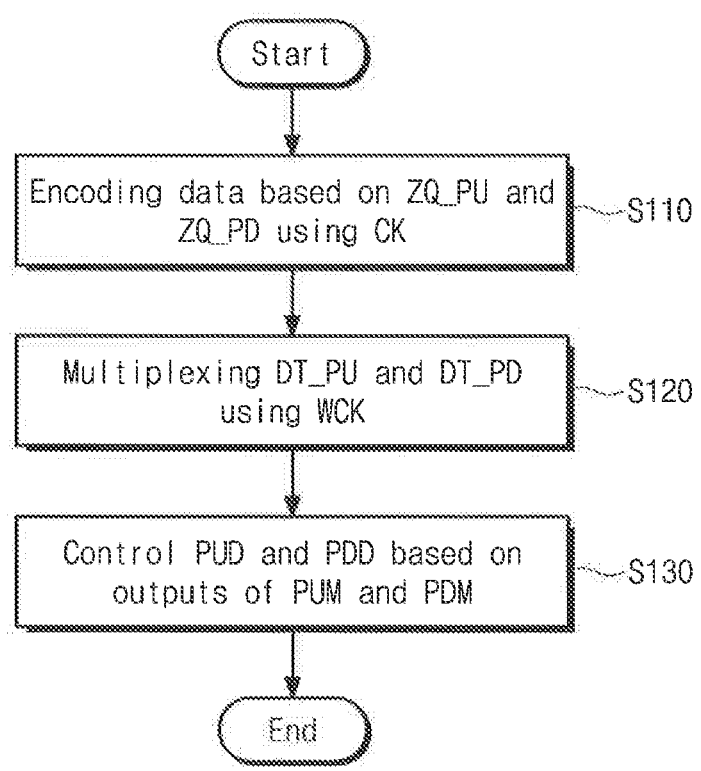
FIG. 8 is a flowchart illustrating an example of operation of the first transmitter of FIG. 7.

FIG. 7 is a block diagram illustrating the first transmitter 121 of FIG. 4 according to an embodiment of the inventive concept. FIG. 8 is a flowchart illustrating an operation of the first transmitter 121 of FIG. 7. Herein below the embodiment of the inventive concept will be described with reference to the first transmitter 121. However, the scope and spirit of the embodiments of the inventive concept may not be limited thereto. The remaining transmitters may have similar structures or may perform similar operations.

Referring to FIGS. 4, 7 and 8, the first transmitter 121 may include a ZQ encoder ENC, a pull-up multiplexer PUM, a pull-down multiplexer PDM, a pull-up driver PUD, and a pull-down driver PDD.

In operation S110 of the flowchart of FIG. 8, the first transmitter 121 may encode the data DT based on the pull-up code ZQ_PU and the pull-down code ZQ_PD by using the system clock CK. For example, the ZQ encoder ENC of the first transmitter 121 may receive the first pull-up code ZQ_PU1 and the first pull-down code ZQ_TD1 from the ZQ controller 110. The ZQ encoder ENC of the first transmitter 121 may receive the data DT read from the memory cell array 130. The first transmitter 121 may encode the received data DT based on the first pull-up code ZQ_PU1 and the first pull-down code ZQ_PD1 to output encoded first pull-up data DT_PU1 and encoded first pull-down data DT_PD1. In this case, the ZQ encoder ENC may perform the above-described encoding operation based on the system clock CK.

In operation S120 of FIG. 8, the first transmitter 121 may perform multiplexing on the pull-up data DT_PU and the pull-down data DT_PD by using the data clock WCK. For example, the pull-up multiplexer PUM of the first transmitter 121 may perform multiplexing on the first encoded pull-up data DT_PU1 and may provide the multiplexing result to the pull-up driver PUD. The pull-down multiplexer PDM of the first transmitter 121 may perform multiplexing on the first pull-down data DT_PD1 and may provide the multiplexing result to the pull-down driver PDD. In this case, the pull-up multiplexer PUM and the pull-down multiplexer PDM may perform the multiplexing operation in synchronization with the data clock WCK.

In operation S130 of FIG. 8, the first transmitter 121 may control the pull-up driver PUD and the pull-down driver PDD based on outputs of the pull-up multiplexer PUM and the pull-down multiplexer PDM, respectively. For example, the pull-up driver PUD of the first transmitter 121 may include a plurality of resistors and switch elements (e.g., transistors) which may be connected in series or in parallel. The pull-up driver PUD may control the plurality of switch elements based on the output from the pull-up multiplexer PUM. The pull-down driver PDD of the first transmitter 121 may include a plurality of resistors and switch elements (e.g., transistors) which may be connected in series or in parallel. The pull-down driver PDD may control the plurality of switch elements based on the output from the pull-down multiplexer PDM. The data DT may be provided to the host 11 through a first data line DQ1 depending on driving of the pull-up driver PUD and the pull-down driver PDD.

In an embodiment of the inventive concept, the pull-up driver PUD and the pull-down driver PDD may perform impedance matching with an external resistor based on the outputs of the pull-up multiplexer PUM and the pull-down multiplexer PDM.

Although not illustrated in FIG. 7, the outputs from the pull-up multiplexer PUM and the pull-down multiplexer PDM may be provided to the pull-up driver PUD and the pull-down driver PDD through a separate delay circuit (not illustrated), respectively. The separate delay circuit may be configured to delay the outputs from the pull-up multiplexer PUM and the pull-down multiplexer PDM depending on a preset value.

As described above at least with reference to FIGS. 7 and 8, the transmitter 121 may perform an encoding operation by using the system clock CK; then by using the data clock WCK, the transmitter 121 may perform a multiplexing operation, or may drive the pull-up driver PUD and the pull-down driver PDD.

Figure 9:
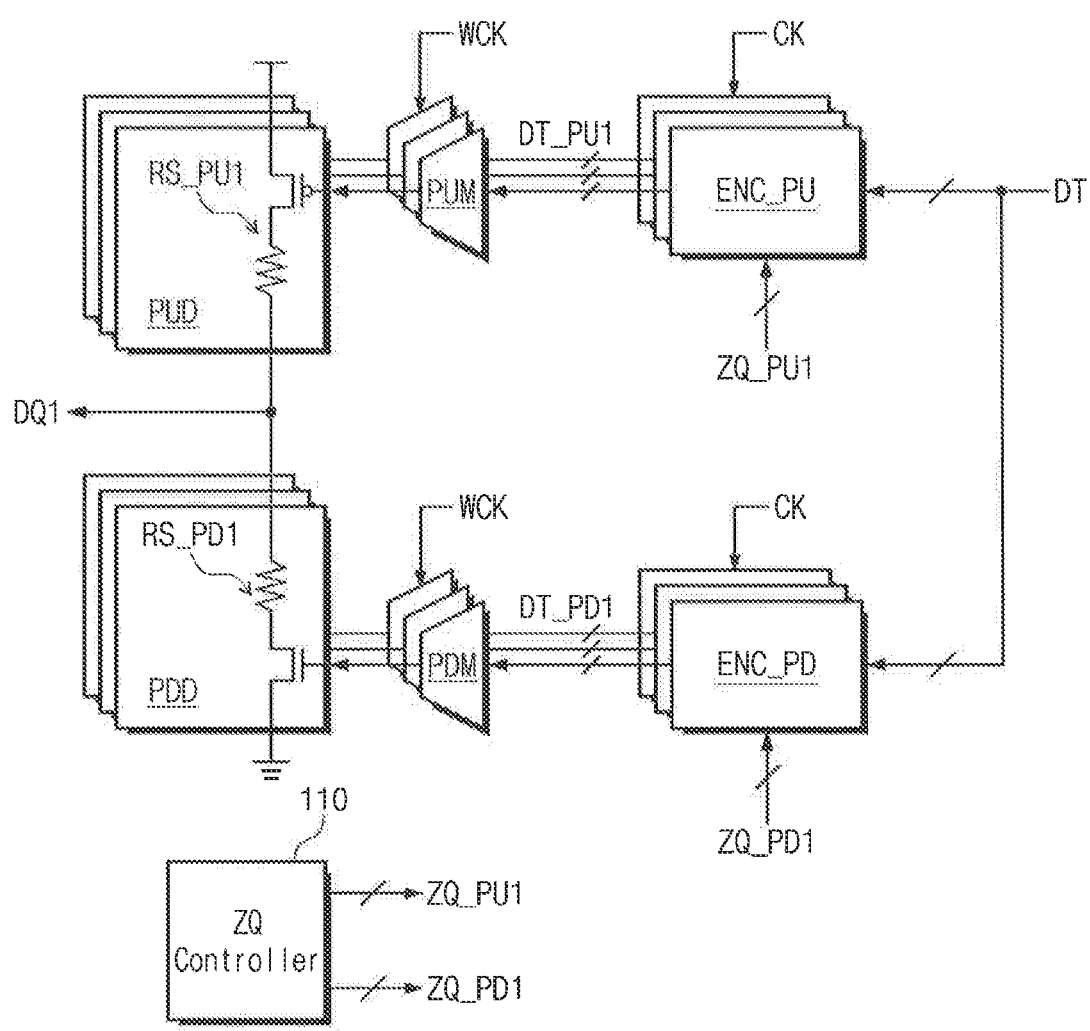
FIG. 9 is a block diagram illustrating the first transmitter of FIG. 7 in detail.

FIG. 9 is a block diagram illustrating the first transmitter 121 of FIG. 7 in more detail. Referring to FIG. 9, the first transmitter 121 may include a plurality of pull-up encoding circuits ENC_PU, a plurality of pull-down encoding circuits ENC_PD, a plurality of pull-up multiplexers PUM, a plurality of pull-down multiplexers PDM, a plurality of pull-up driver circuits PUD, and a plurality of pull-down driver circuits PDD. As shown in the example in FIG. 9, the pull-up components and the pull-down components of the transmitter 121 may have respective connections for each data line. However, the embodiments of the inventive concept are not limited to the arrangement shown in FIG. 9. Although FIG.

9 shows three of each of the ENC_PU, PUM, PUD, ENC_PD, and PDD, the embodiments of the inventive concept are not limited to the quantity of components or the arrangement shown in FIG. 9.

As described above, the ZQ controller 110 may output the first pull-up code ZQ_PU1 and the first pull-down code ZQ_PD1. Each of the plurality of pull-up encoding circuits ENC_PU may receive the corresponding part or all of the first pull-up code ZQ_PU1, and the data DT. The plurality of pull-up encoding circuits ENC_PU may encode the data DT based on the received codes and may output the encoded first pull-up data DT_PU1 as the encoding result. In this case, each of the plurality of pull-up encoding circuits ENC_PU may operate based on the system clock CK. In an embodiment, the first pull-up data DT_PU1 may include a control value for controlling the plurality of pull-up driver circuits PUD depending on a bit value of the data DT, respectively.

The plurality of pull-up multiplexers PUM may perform multiplexing on the encoded first pull-up data DT_PU1 from the plurality of pull-up encoding circuits ENC_PU. In this case, each of the plurality of pull-up multiplexers PUM may perform the above-described multiplexing operation based on the data clock WCK. In other words, the plurality of pull-up multiplexers PUM may serialize and output the first pull-up data DT_PU1 based on the data clock WCK.

The plurality of pull-up driver circuits PUD may operate based on outputs from the plurality of pull-up multiplexers PUM, respectively, and the first data line DQ1 may be charged with a power supply voltage by operations of the plurality of pull-up driver circuits PUD.

For example, with reference to FIG. 9, each of the plurality of pull-up driver circuits PUD may include a first pull-up resistor string RS_PU1. The first pull-up resistor string RS_PU1 may include a resistor and a switch element (e.g., a transistor) connected in series. A first end of the first pull-up resistor string RS_PU1 may be connected with a node of the power supply voltage, and a second end thereof may be connected with a node of the first data line DQ1. The switch element of the first resistor string RS_PU1 may operate in response to a corresponding output from the pull-up multiplexers PUM. Impedance matching associated with the first data line DQ1 may be accomplished by turning-on or turning-off of the switch element included in the first pull-up resistor string RS_PU1 of each of the plurality of pull-up driver circuits PUD.

Each of the plurality of pull-down encoding circuits ENC_PD may receive the corresponding part or all of the first pull-down code ZQ_PD1, and the data DT. The plurality of pull-down encoding circuits ENC_PD may encode the data DT based on the received codes and may output the first pull-down data DT_PD1 as the encoding result, respectively. In this case, each of the plurality of pull-down encoding circuits ENC_PD may operate based on the system clock CK.

With continued reference to FIG. 9, the plurality of pull-down multiplexers PDM may perform multiplexing on the first pull-down data DT_PD1 from the plurality of pull-down encoding circuits ENC_PD. In this case, each of the plurality of pull-down multiplexers PDM may perform the above-described multiplexing operation based on the data clock WCK. In other words, the plurality of pull-down multiplexers PDM may serialize and output the first pull-down data DT_PD1 based on the data clock WCK.

The plurality of pull-down driver circuits PDD may operate based on the outputs from the plurality of pull-down multiplexers PDM. For example, each of the plurality of pull-down driver circuits PDD may include a first pull-down resistor string RS_PD1. The first pull-down resistor string RS_PD1 may include a resistor and a switch element (e.g., a transistor) connected in series. A first end of the first pull-down resistor string RS_PD1 may be connected with the first data line DQ1, and a second end thereof may be grounded. The switch elements of the first pull-down resistor string RS_PD1 of each of the plurality of pull-down driver circuits PDD may operate based on the corresponding outputs from the plurality of pull-down multiplexers PDM. Impedance matching associated with the first data line DQ1 may be performed by turning-on or turning-off of the switch elements included in a plurality of pull-down resistor strings RS_PD1.

As described above, the first transmitter 121 may control the first data line DQ1 by using the plurality of pull-up encoding circuits ENC_PU, the plurality of pull-down encoding circuits ENC_PD, the plurality of pull-up multiplexers PUM, the plurality of pull-down multiplexers PDM, the plurality of pull-up driver circuits PUD, and the plurality of pull-down driver circuits PDD. In this case, the plurality of pull-up encoding circuits ENC_PU and the plurality of pull-down encoding circuits ENC_PD may operate based on the system clock CK, and the plurality of pull-up multiplexers PUM, the plurality of pull-down multiplexers PDM, the plurality of pull-up driver circuits PUD, and the plurality of pull-down driver circuits PDD may operate based on the data clock WCK. Accordingly, since the encoding operation is performed based on the relatively slow system clock CK, power consumption and power noise may be reduced. Reliability may be enhanced with a reduction in errors due to less noise being generated.

Figure 10:
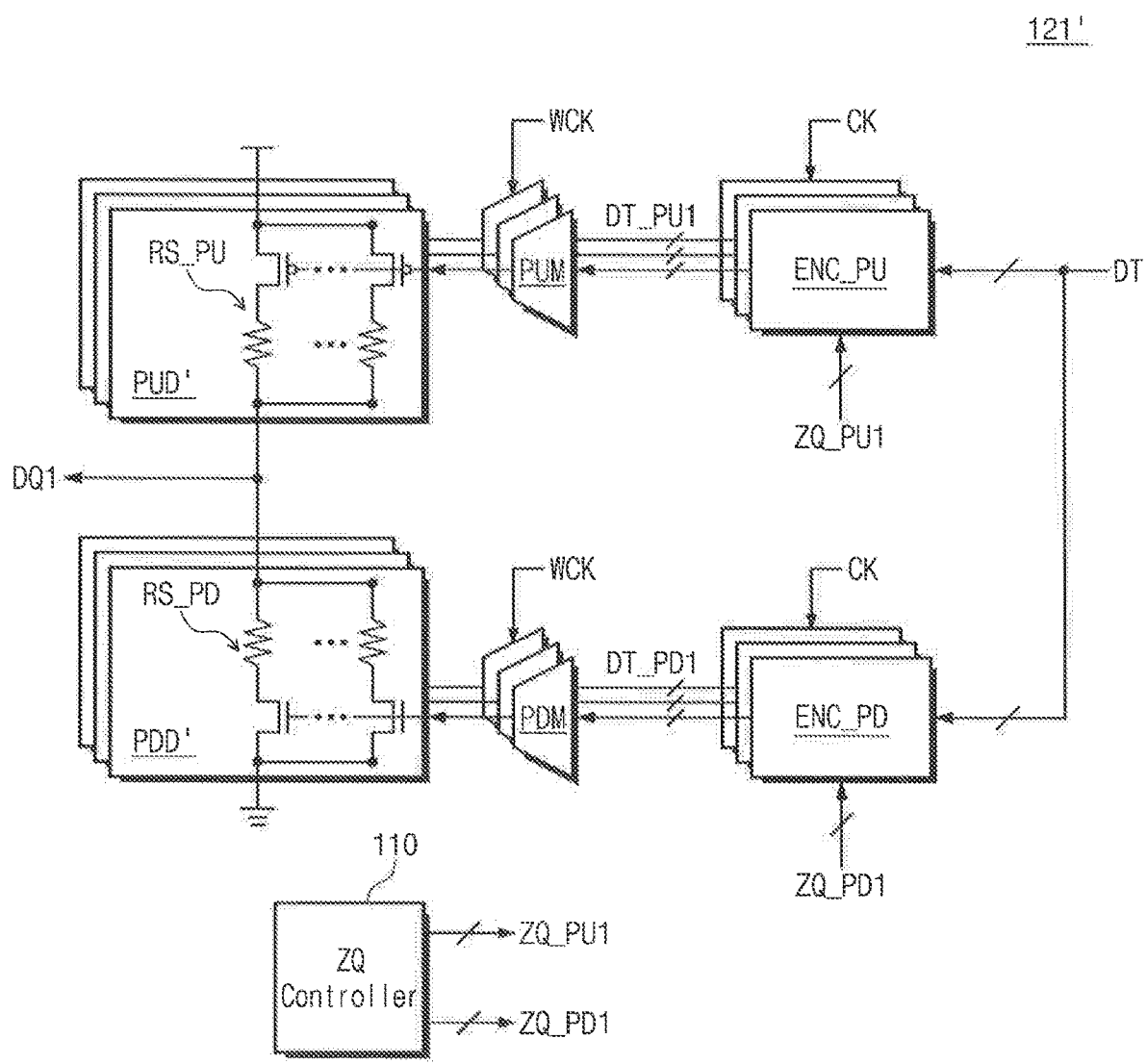
FIG. 10 is a block diagram illustrating another embodiment of the first transmitter of FIG. 9.

FIG. 10 is a block diagram illustrating another embodiment of the first transmitter 121 of FIG. 9. Referring to FIG. 10, a first transmitter 121' may include the plurality of pull-up encoding circuits ENC_PU, the plurality of pull-down encoding circuits ENC_PD, the plurality of pull-up multiplexers PUM, the plurality of pull-down multiplexers PDM, a plurality of pull-up driver circuits PUD', and a plurality of pull-down driver circuits PDD'. The plurality of pull-up encoding circuits ENC_PU, the plurality of pull-down encoding circuits ENC_PD, the plurality of pull-up multiplexers PUM, the plurality of pull-down multiplexers PDM are described with reference to FIG. 9, and thus, a description thereof will not be repeated here.

Unlike the embodiment of FIG. 9, each of the plurality of pull-up driver circuits PUD' of FIG. 10 may include at least two pull-up resistor strings RS_PU, and each of the plurality of pull-down driver circuits PDD' may include at least two pull-down resistor strings RS_PD. For example, each of the plurality of pull-up driver circuits PUD' and the plurality of pull-down driver circuits PDD' may be configured to include a plurality of resistor strings.

Figure 11:
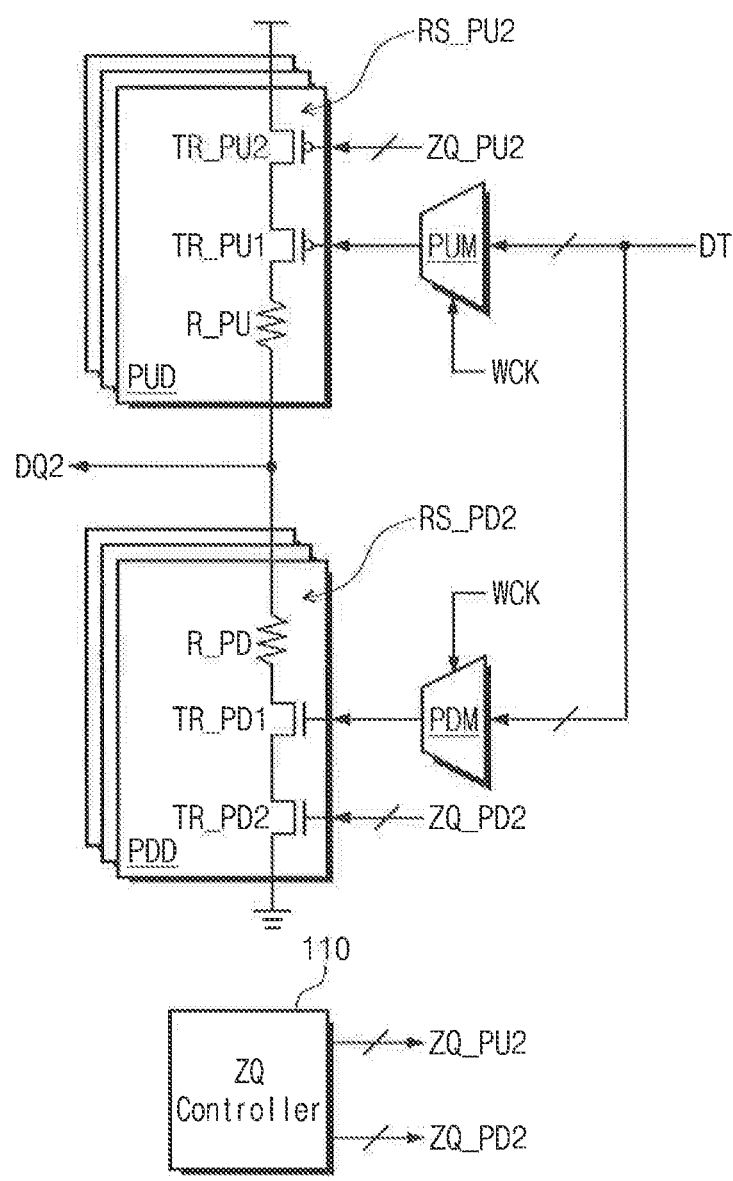
FIG. 11 is block diagram illustrating a second transmitter of FIG. 4.

FIG. 11 is a block diagram illustrating the second transmitter 122 of FIG. 4. In an embodiment, a configuration of the second transmitter 122 will be described with reference to FIG. 11, but the scope and spirit of the embodiments of the inventive concept is not limited thereto. In an embodiment, the data line driver 120 may include the structure of the first transmitter 121 described with reference to FIGS. 7 to 10 or may include the structure of the second transmitter 122 to be described with reference to FIG. 11.

Referring to FIG. 11, the second transmitter 122 may include a pull-up multiplexer PUM, a pull-down multiplexer PDM, a plurality of pull-up drivers PUD, and a plurality of pull-down drivers PDD. The pull-up multiplexer PUM may perform multiplexing on the data DT based on the data clock WCK. In other words, the pull-up multiplexer PUM may serialize and output the data DT based on the data clock WCK.

Each of the plurality of pull-up drivers PUD may operate based on an output from the pull-up multiplexer PUM and a second pull-up code ZQ_PU2. For example, each of the plurality of pull-up drivers PUD may include a second pull-up resistor string RS_PU2. The second pull-up resistor string RS_PU2 may include a pull-up resistor R_PU and first and second pull-up switches TR_PU1 and TR_PU2. The first pull-up switch TR_PU1 may operate in response to the output from the pull-up multiplexer PUM, and the second pull-up switch TR_PU2 may operate in response to the second pull-up code ZQ_PU2.

The pull-down multiplexer PDM may perform multiplexing on the data DT based on the data clock WCK. In other words, the pull-down multiplexer PDM may serialize and output the data DT based on the data clock WCK.

Each of the plurality of pull-down drivers PDD may operate based on an output from the pull-down multiplexer PDM and a second pull-down code ZQ_PD2. For example, each of the plurality of pull-down driver circuits PDD may include a second pull-down resistor string RS_PD2. The second pull-down resistor string RS_PD2 may include a pull-down resistor R_PD and first and second pull-down switches TR_PD1 and TR_PD2. The first pull-down switch TR_PD1 may operate in response to the output from the pull-down multiplexer PDM, and the second pull-down switch TR_PD2 may operate in response to the second pull-down code ZQ_PD2.

As described above, the second transmitter 122 may be configured to drive a second data line DQ2 without a separate encoding operation. Also, compared with the first transmitters 121 and 121' of FIGS. 9 and 10, the second transmitter 122 may drive the second data line DQ2 by using one pull-up multiplexer PUM and one pull-down multiplexer PDM.

Figure 12:
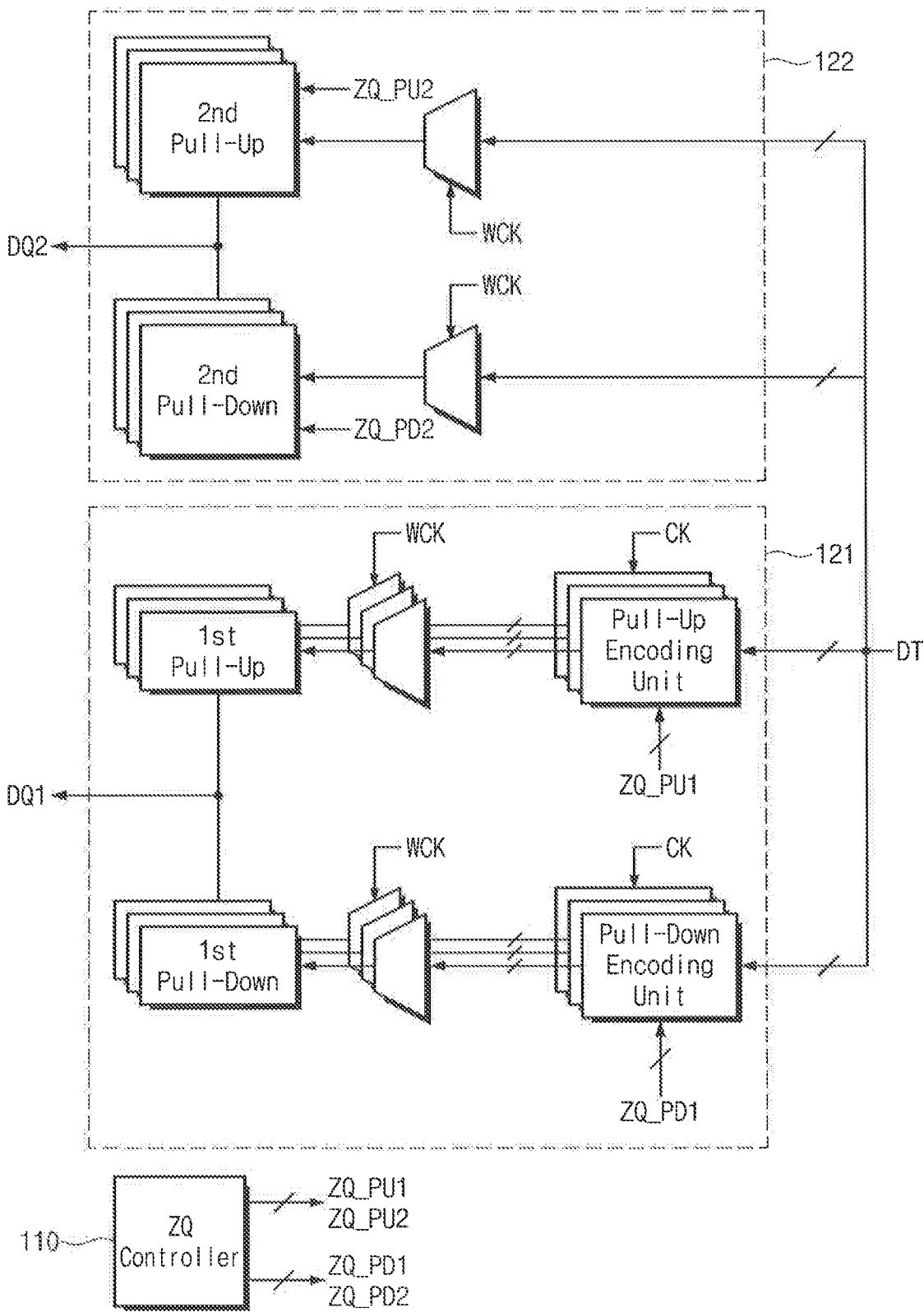
FIG. 12 is a block diagram illustrating a structure of the first and second transmitters of FIG. 4.

FIG. 12 is a block diagram illustrating a structure of the first and second transmitters of FIG. 4. Referring to FIG. 12, the data line driver 120 may include the first and second transmitters 121 and 122.

The first transmitter 121 may include a plurality of first pull-up encoding circuits, a plurality of first pull-up multiplexers, a plurality of first drivers, a plurality of first pull-down encoding circuits, a plurality of first pull-down multiplexers, and a plurality of first pull-down drivers. The second transmitter 122 may include a plurality of second pull-up multiplexers, a plurality of second pull-down multiplexers, a plurality of second pull-up drivers, and a plurality of second pull-down drivers.

Since the first transmitter 121 is the same as the first transmitter described with reference to FIG. 10 and the second transmitter 122 is the same as the second transmitter described with reference to FIG. 11, for brevity of illustration, reference numerals of the same components are omitted in FIG. 12. Also, the respective components of FIG. 12 are described with reference to FIGS. 10 and 11, and thus, a detailed description thereof will not be repeated here.

In an embodiment, the first transmitter 121 and the second transmitter 122 that control different data lines (e.g., the first and second data lines DQ1 and DQ2) respectively in the memory device 100 may have different structures. In an embodiment, the first and second data lines DQ1 and DQ2 respectively driven by the first transmitter 121 and the second transmitter 122 may be data lines for transmitting and receiving data to and from the host 11. Alternatively, a part of the first and second data lines DQ1 and DQ2 may be a signal line for transmitting and receiving information other than data to and from the host 11.

Although not illustrated in FIG. 12, signal lines driven by the first transmitter 121 and the second transmitter 122 described above are not limited to data lines. The first transmitter 121 and the second transmitter 122 may be configured to drive any other control signal lines.

Although not illustrated in FIG. 12, the first transmitter 121 and the second transmitter 122 described above may be included in the host 11 and may be configured to control a plurality of data lines DQ or to drive any other control signals, for the purpose of providing data from the host 11 to the memory device 100.

Figure 13:
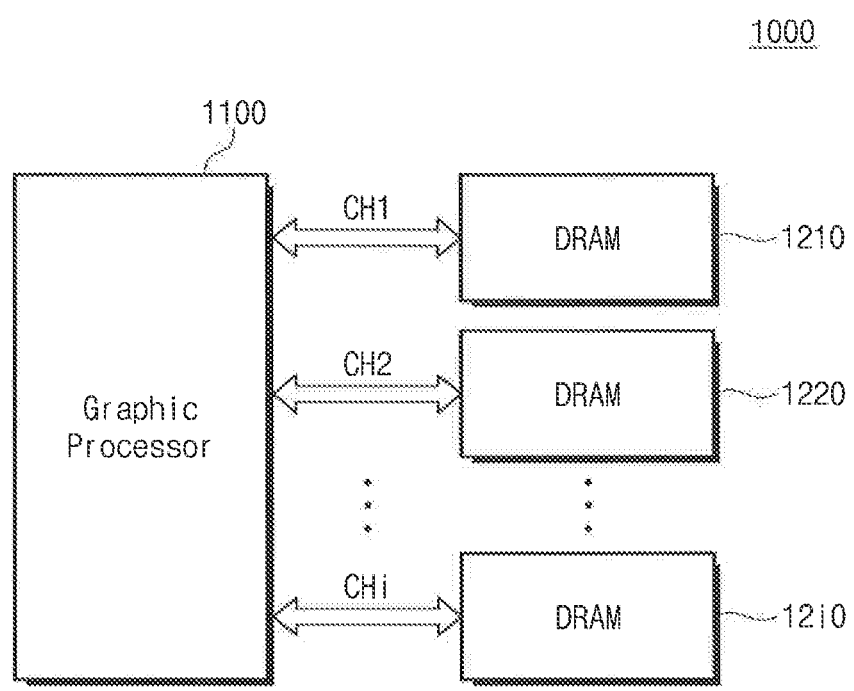
FIG. 13 is a block diagram illustrating a graphic system to which the memory device according to an embodiment of the inventive concept is applied.

FIG. 13 is a block diagram illustrating a graphic system to which the memory device according to embodiments of the inventive concept may be applied. Referring to FIG. 13, a graphic system 1000 may include a graphic processor 1100 and a plurality of DRAM devices 1210 to 12$i$0. The graphic processor 1100 may be configured to perform various operations for processing image information. The graphic processor 1100 may be connected with the plurality of DRAM devices 1210 to 12$i$0 through a plurality of channels CH1 to CHi. In an embodiment, each of the plurality of channels CH1 to CHi may be communication channel that is based on a graphic double data rate (GDDR) interface.

Each of the plurality of DRAM devices 1210 to 12$i$0 may include the transmitters described with reference to FIGS. 1 to 12. For example, each of the plurality of DRAM devices 1210 to 12$i$0 may drive a plurality of data lines depending on the structure or manner described with reference to FIGS. 1 to 12.

Figure 14:
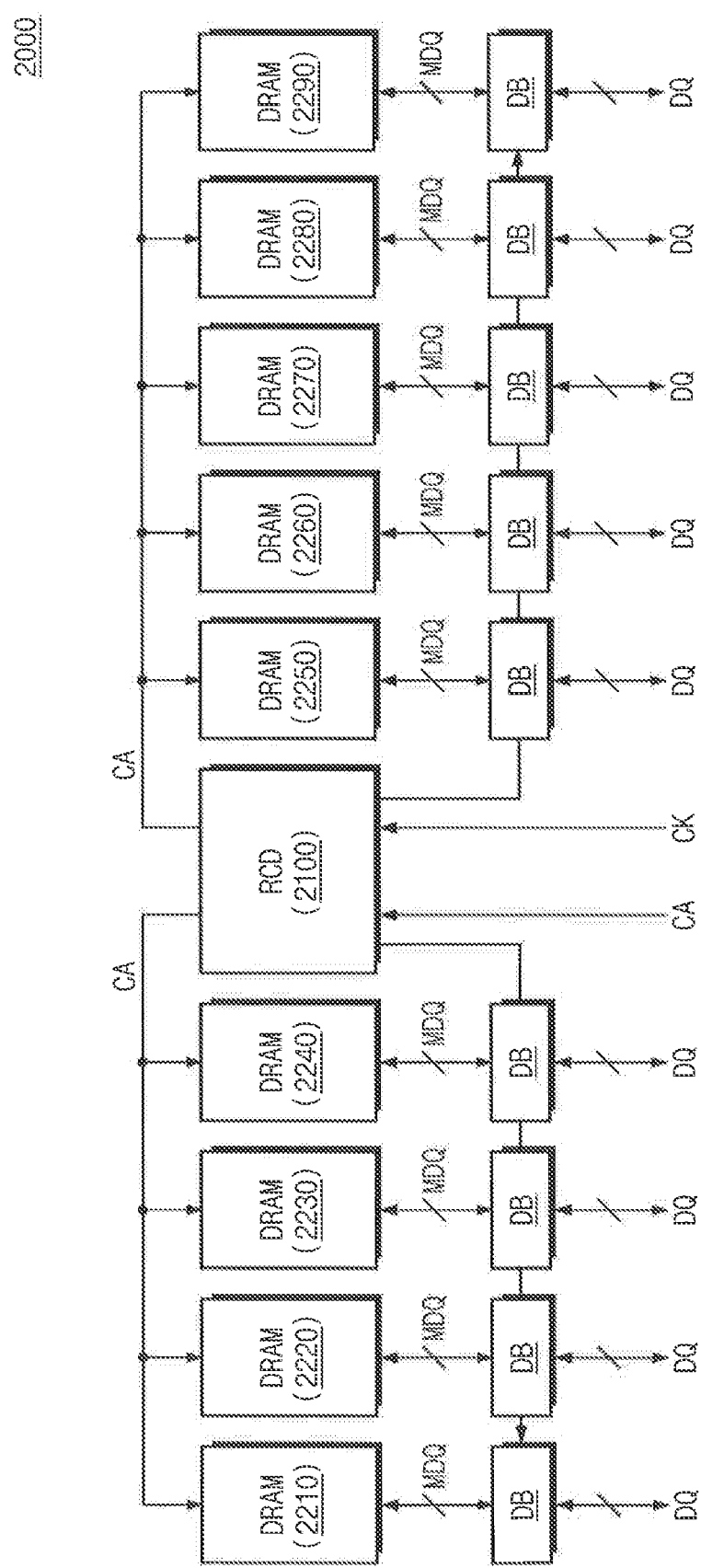
FIG. 14 is a block diagram illustrating a memory module to which the memory device according to an embodiment of the inventive concept is applied.

FIG. 14 is a block diagram illustrating a memory module 2000 to which a memory device according to the inventive concept is applied. Referring to FIG. 14, the memory module 2000 may include a register dock driver RCD 2100, a plurality of DRAM devices 2210 to 2290, and a plurality of data buffers DB.

The RCD 2100 may receive a command/address CA and a clock signal CK from an external device (e.g., a host or a memory controller). Based on the received signals, the RCD 2100 may send the command/address CA to the plurality of DRAM devices 2210 to 2290 and may control the plurality of data buffers DB.

The plurality of DRAM devices 2210 to 2290 may be respectively connected with the plurality of data buffers DB through memory data lines MDQ. In an embodiment, the plurality of DRAM devices 2210 to 2290 may include the transmitters described with reference to FIGS. 1 to 12. The plurality of data buffers DB may transmit and receive data to and from an external device (e.g., a host or a memory controller) through a plurality of data lines DQ.

In an embodiment of the inventive concept, the memory module 2000 illustrated in FIG. 14 may have the form factor of a load reduced dual in-line memory module (LRDIMM). However, the scope and spirit of the embodiments of the inventive concept may not be limited thereto. For example, the memory module 2000 illustrated in FIG. 14 may have the form factor of a registered DIMM (RDIMM) in which the plurality of data buffers DB are not included.

Figure 15:
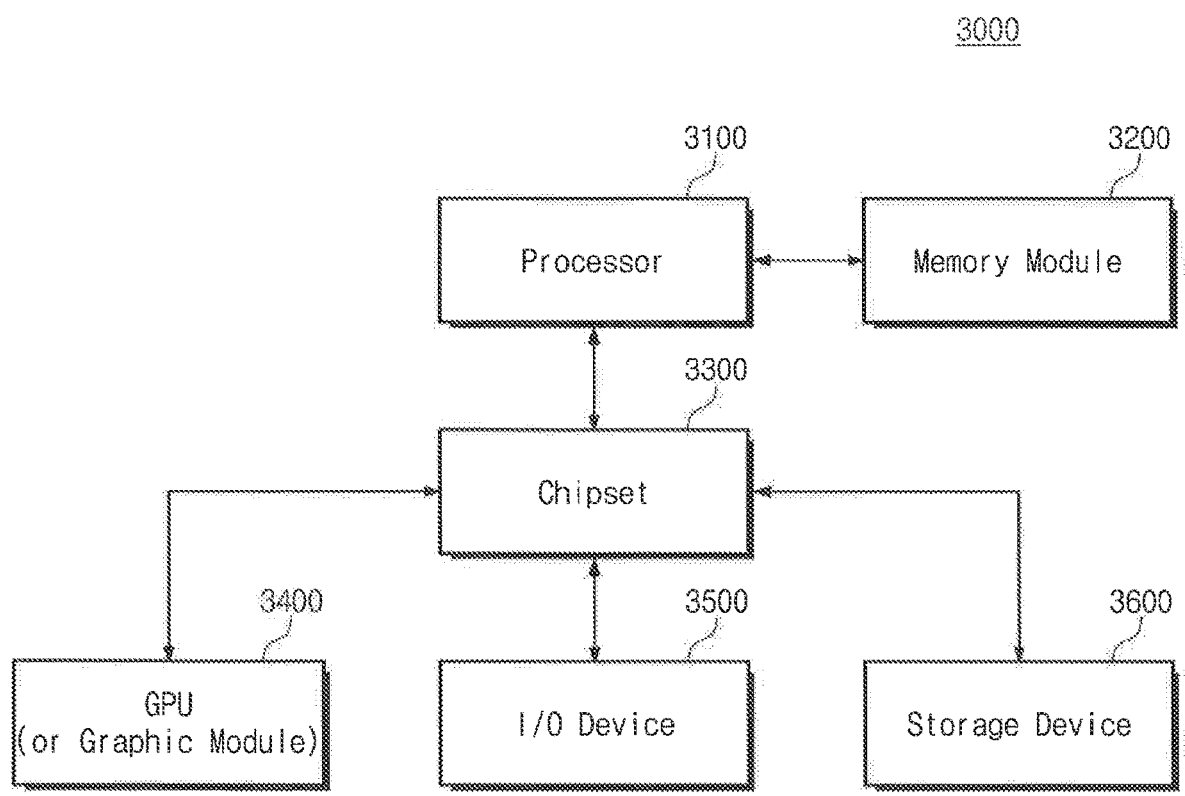
FIG. 15 is a block diagram schematically illustrating a computing system to which the memory device according to an embodiment of the inventive concept is applied.

FIG. 15 is a block diagram illustrating a computing system 3000 to which a memory device according to embodiments of the inventive concept may be applied. Referring to FIG. 15, the computing system 3000 may include one of a computer, a portable computer, a ultra-mobile personal computer (UMPC), a workstation, a server computer, a net-book, a personal digital assistant (PDA), a portable computer, a web tablet, a wireless phone, a mobile phone, a smartphone, a digital camera, a digital audio recorder, a digital audio player, a digital picture recorder, a digital picture player, a digital video recorder, a digital video player, a device capable of transmitting or receiving information in a wireless environment, various electronic devices including a home network.

The computing system 3000 may include a processor 3100, a memory module 3200, a chipset 3300, a graphic processing unit GPU 3400 (or a graphic module), an input/output device 3500, and a storage device 3600. The processor 3100 may perform overall operations of the computing system 3000. The processor 3100 may perform various operations to be executed on the computing system 3000.

The memory module 3200 may be directly connected with the processor 3100. For example, the memory module 3200 may have a form of a dual in-line memory module (DIMM), and the memory module 3200 may be installed in a DIMM socket directly connected with the processor 101 and may communicate with the processor 3100. In an embodiment, the memory module 3200 may include the memory device described with reference to FIGS. 1 to 12.

The chipset 3300 may be electrically connected with the processor 3100 and may control hardware of the computing system 3000 under control of the processor 3100. For example, the chipset 3300 may be connected with each of the GPU 3400, the input/output device 3500, and the storage device 3600 through main buses, and may perform a bridge operation with respect to the main buses.

The GPU 3400 may perform a series of arithmetic operations for outputting image data of the computing system 3000. In an embodiment, the GPU 3400 may be embedded in the processor 3100 in the form of a system-on-chip. In an embodiment, the GPU 3400 may include the memory device described with reference to FIGS. 1 to 12.

The input/output device 3500 may include various devices that make it possible to input data or an instruction to the computing system 3000 or to output data to an external device. The storage device 3600 may be used as a mass storage medium of the computing system 3000. The storage device 3600 may include mass storage media such as a hard disk drive (HDD), a solid-state drive (SSD), a memory card, and a memory stick.

As described above, the memory device according to the embodiments of the inventive concept may control impedance of each of a plurality of data lines. In this case, a transmitter of the memory device may encode data by using the relatively slow system clock CK and may drive the plurality of data lines based on the encoded data by using the relatively fast data clock WCK. Accordingly, since power consumption and power noise are reduced, a memory device with enhanced performance and an operation method thereof are provided.

According to an embodiment of the inventive concept, a memory device includes a data line driver that performs ZQ encoding by using a first clock and drives a pull-up driver and a pull-down driver by using a second clock that has a faster frequency than the first clock. Accordingly, since ZQ encoding is performed by using a relatively slow clock, power consumption and power noise may be reduced. Accordingly, a memory device with reduced power consumption, enhanced reliability, and enhanced performance may be provided.

While the embodiments of inventive concept have been described with reference to the examples herein above, it will be apparent to those of ordinary skill in the art that various changes and modifications may be made thereto without departing, from the spirit and scope of the embodiments of the inventive concept as set forth in the following claims.

What is claimed is:

1. A memory device comprising:
   a memory cell array including a plurality of memory cells configured to store a first data;
   a first transmitter configured to transmit the first data to an external device through a first data line; and
   a ZQ controller configured to perform a ZQ calibration operation to generate a first ZQ code,
   wherein the first transmitter includes:
   an encoding circuit configured to encode the first ZQ code and the first data based on a first clock; and
   a driver circuit configured to drive the first data line based on the encoded result based on a second clock.

2. The memory device of claim 1, wherein a frequency of the first clock is lower than a frequency of the second clock.

3. The memory device of claim 1, wherein the first clock is a system clock that is provided from the external device to determine a command or an address provided from the external device, and
   wherein the second clock is a data clock that is provided from the external device to process the first data.

4. The memory device of claim 1, wherein the first ZQ code generated by the ZQ controller includes a pull-up code, and
   wherein the first transmitter includes:
   at least one pull-up encoding circuit configured to encode the pull-up code and the first data based on the first clock, to output a pull-up data;
   at least one pull-up multiplexer configured to serialize and output the pull-up data based on the second clock; and
   at least one pull-up driver connected between a power supply voltage and the first data line and configured to control the first data line based on an output from the at least one pull-up multiplexer.

5. The memory device of claim 4, wherein the at least one pull-up driver includes:
   a resistance element connected between the power supply voltage and a first node; and
   a switch element connected between the first node and the first data line and configured to operate based on the output of the at least one pull-up multiplexer.

6. The memory device of claim 4, wherein the first transmitter further includes:
   a delay circuit configured to delay the output of the at least one pull-up multiplexer based on a preset value.

7. The memory device of claim 4, wherein the first ZQ code further includes a pull-down code, and
   wherein the first transmitter further includes:
   at least one pull-down encoding circuit configured to encode the pull-down code and the first data based on the first clock, to output a pull-down data;
   at least one pull-down multiplexer configured to serialize and output the pull-down data from the at least one pull-down encoding circuit based on the second clock; and
   at least one pull-down driver connected between the first data line and a ground voltage and configured to control the first data line based on an output from the at least one pull-down multiplexer.

8. The memory device of claim 1, wherein the ZQ controller is configured to:
   determine the first ZQ code through a ZQ calibration operation.

9. The memory device of claim 1, wherein the plurality of memory cells store a second data, the memory device further comprising:
a second transmitter configured to transmit the second data through a second data line,
wherein the ZQ controller is further configured to generate a second ZQ code for impedance matching of the second data line,
wherein the second transmitter includes:
a pull-up multiplexer configured to serialize and output the second data based on the second clock;
a pull-up driver configured to drive the second data line based on an output from the pull-up multiplexer and a pull-up code of the second ZQ code;
a pull-down multiplexer configured to serialize and output the second data based on the second clock; and
a pull-down driver configured to drive the second data line based on an output from the pull-down multiplexer and a pull-down code of the second ZQ code.

10. The memory device of claim 9, wherein each of the plurality of memory cells comprises a dynamic random access memory (DRAM) cell.

11. An operation method of a memory device, the method comprising:
encoding, by an encoding circuit, data and a ZQ code from a ZQ controller based on a first clock to generate pull-up data and pull-down data;
receiving, by a multiplexer, the pull-up data, the pull-down data, and a second clock different from the first clock;
serializing, by the multiplexer, the pull-up data and the pull-down data based on the second clock; and
driving, by a driver circuit, a first data line based on the serialized pull-up data and the serialized pull-down data.

12. The method of claim 11, further comprising:
generating the ZQ code through a ZQ calibration operation associated with the first data line.

13. The method of claim 11, wherein a frequency of the first clock is lower than a frequency of the second clock.

14. The method of claim 11, wherein the first data line is driven by a pull-up driver connected between a power supply voltage and the first data line operates based on the serialized pull-up data and a pull-down driver connected between the first data line and a ground voltage operates based on the serialized pull-down data.

15. The method of claim 11, wherein the data are provided to an external device as the first data line is being driven, and
detecting signals from a plurality of data lines to determine data provided from a host.

16. A memory device comprising:
a memory cell array including a plurality of memory cells configured to store data;
a data line driver configured to provide the stored data to an external device through a plurality of data lines; and
a ZQ controller configured to generate a ZQ code associated with each of the plurality of data lines,
wherein the data line driver is configured to:
encode the ZQ code and the data based on a first clock to generate pull-up data and pull-down data, with respect to each of the plurality of data lines;
serialize the pull-up data and the pull-down data based on a second clock; and
respectively drive the plurality of data lines based on the serialized pull-up data and the serialized pull-down data, and
wherein the data line driver includes a multiplexer configured to receive the second clock and serialize the pull-up data and the pull-down data based on the second clock.

17. The memory device of claim 16, wherein a frequency of the the first clock is lower than a frequency of the second clock.

18. The memory device of claim 16, wherein the data line driver includes:
a plurality of transmitters configured to drive the plurality of data lines, respectively, and
wherein each of the plurality of transmitters includes:
at least one pull-up encoding circuit configured to encode the ZQ code and the data based on the first clock, to output the pull-up data;
at least one pull-up multiplexer configured to serialize and output the pull-up data based on the second clock;
at least one pull-up driver connected between a corresponding data line of the plurality of data lines and a power supply voltage and configured to operate based on an output from the at least one pull-up multiplexer;
at least one pull-down encoding circuit configured to encode the ZQ code and the data based on the first clock, to output the pull-down data;
at least one pull-down multiplexer configured to serialize and output the pull-down data based on the second clock; and
at least one pull-down driver connected between the corresponding data line and a ground voltage and configured to operate based on an output from the at least one pull-down multiplexer.

19. The memory device of claim 18, wherein impedance matching of the corresponding data line performed by operations of the at least one pull-up driver and the at least one pull-down driver.

20. The memory device of claim 16, wherein the ZQ controller is configured to:
determine the ZQ code associated with each of the plurality of data lines through a ZQ calibration operation.

* * * * *